United States Patent [19]

Kawamura et al.

[11] Patent Number: 5,431,955
[45] Date of Patent: Jul. 11, 1995

[54] HIGH FREQUENCY CONDUCTIVE MATERIAL AND RESONATOR AND METHOD FOR MAKING

[75] Inventors: Keizou Kawamura; Makoto Kobayashi, both of Tokyo, Japan

[73] Assignee: TDK Corporation, Tokyo, Japan

[21] Appl. No.: 269,785

[22] Filed: Jul. 1, 1994

Related U.S. Application Data

[63] Continuation of Ser. No. 926,634, Aug. 10, 1992, abandoned.

[30] Foreign Application Priority Data

Aug. 9, 1991 [JP] Japan ............................. 3-224979

[51] Int. Cl.⁶ .................... B05D 5/12; C03C 14/00; C04B 35/46
[52] U.S. Cl. ................... 427/126.2; 252/500; 252/518; 252/520; 252/521; 427/96; 427/126.1; 427/126.3; 427/126.4; 427/376.2; 428/689; 428/699; 501/32; 501/134; 501/136
[58] Field of Search ............ 501/32, 134, 136; 428/426, 689, 699; 427/96, 126.1, 126.2, 126.3, 126.4, 376.2; 252/500, 518, 520, 521

[56] References Cited

U.S. PATENT DOCUMENTS

| | | | |
|---|---|---|---|
| 4,335,216 | 6/1982 | Hodgkins et al. | 501/32 |
| 4,699,891 | 10/1987 | Sato et al. | 501/139 |
| 4,775,649 | 10/1988 | Kitoh et al. | 501/138 |
| 4,777,092 | 10/1988 | Kawakami et al. | 501/32 |
| 5,093,291 | 3/1992 | Kawabata et al. | 501/32 |
| 5,137,848 | 8/1992 | Barker et al. | 501/32 |
| 5,229,213 | 7/1993 | Horiuchi et al. | 428/457 |
| 5,242,867 | 9/1993 | Lin et al. | 501/32 |

FOREIGN PATENT DOCUMENTS

| | | |
|---|---|---|
| 396155 | 11/1990 | European Pat. Off. |
| 468801 | 1/1992 | European Pat. Off. |
| 54-54300 | 4/1979 | Japan |
| 60-3801 | 1/1985 | Japan |
| 63-2204 | 1/1988 | Japan |
| 63-291307 | 11/1988 | Japan |
| 64-045743 | 2/1989 | Japan |
| 64-051346 | 2/1989 | Japan |
| 3-45556 | 2/1991 | Japan |
| 4-82297 | 3/1992 | Japan |

OTHER PUBLICATIONS

Ouchi, "Micro-Wave Dielectric Ceramics", Electronic Ceramis, Mar. 1988.
European Search Report No. 92916809.4 Apr. 1994.
Abstract (Derwent) #91-104559 for Japanese Patent #3-45556 Feb. 1991.

*Primary Examiner*—Anthony Green
*Attorney, Agent, or Firm*—Oblon, Spivak, McClelland, Maier, & Neustadt

[57] ABSTRACT

Glass, an oxide aggregate with a positive $\tau\epsilon$ and an oxide aggregate with a negative $\tau\epsilon$ are mixed in a prescribed ratio by volume so as to bring the $\tau\epsilon$ of a high-frequency dielectric material close to $-12$ ppm/°C. and bring the resonant frequency temperature coefficient $\tau f$ of a high-frequency resonator near zero.

11 Claims, 1 Drawing Sheet

HIGH FREQUENCY CONDUCTIVE MATERIAL AND RESONATOR AND METHOD FOR MAKING

This is a continuation of application Ser. No. 07/926,634, filed on Aug. 10, 1992, now abandoned.

BACKGROUND OF THE INVENTION

1. Field of the Invention

This invention relates to a high-frequency dielectric material suitable for a high-frequency resonator, a resonator, and methods for producing the same.

2. Background Art

As substrate materials for use in electrical and electronic printed circuit boards, there have been developed some which can be sintered at low temperature. Using these, it is possible to sinter the substrate material, conductors, resistors and the like, simultaneously and integrally, at a low temperature of or below 1,000° C., for example. Such low-temperature sintered boards are used at frequencies in the low-frequency band of, for example, about 0.5 GHz or lower, and as the substrate material there is generally used a low sintering temperature material containing glass having a softening point of about 700°-900° C. and $Al_2O_3$ aggregate.

The inventors test-fabricated a high-frequency resonator by laminating dielectric layers formed using the low sintering temperature material mentioned above and forming a strip line between these dielectric layers to obtain a tri-plate circuit.

However, the dielectric constant of the dielectric layers formed using the low sintering temperature material varied with temperature. For example, the dielectric constant temperature coefficient $\tau\epsilon$ at a frequency of 2 GHz was about 130 ppm/°C. It was thus found that when the resonator is used in a high-frequency band, for example at a frequency of 0.5 GHz or higher, its resonant frequency varies greatly with temperature, making it difficult to use in practical applications.

DISCLOSURE OF THE INVENTION

The object of the invention is to provide a high-frequency dielectric material which improves the resonant frequency temperature characteristics of a high-frequency resonator and a resonator using such a high-frequency dielectric material.

This object is accomplished by (1)–(12) of the present invention set out below.

(1) A high-frequency dielectric material containing glass, an oxide aggregate with a positive dielectric constant temperature coefficient $\tau\epsilon$ and an oxide aggregate with a negative dielectric constant temperature coefficient $\tau\epsilon$ (but not containing aluminum oxide and titanium oxide together).

(2) A high-frequency dielectric material according to (1) above, wherein the oxide aggregate with a positive $\tau\epsilon$ is one or both of aluminum oxide and magnesium titanate and the oxide aggregate with a negative $\tau\epsilon$ is one or more of calcium titanate, strontium titanate and titanium oxide, but wherein aluminum oxide and titanium oxide are not contained together.

(3) A high-frequency dielectric material according to (2) above, which contains calcium titanate as the oxide aggregate with a negative $\tau\epsilon$ and magnesium titanate or aluminum oxide as the oxide aggregate with a positive $\tau\epsilon$, the calcium titanate content of the oxide aggregates being 5–20% by volume.

(4) A high-frequency dielectric material according to (2) above, which contains strontium titanate as the oxide aggregate with a negative $\tau\epsilon$ and magnesium titanate or aluminum oxide as the oxide aggregate with a positive $\tau\epsilon$, the strontium titanate content of the oxide aggregates being 2–10% by volume.

(5) A high-frequency dielectric material according to (2) above, which contains titanium oxide as the oxide aggregate with a negative $\tau\epsilon$ and magnesium titanate as the oxide aggregate with a positive $\tau\epsilon$, the titanium oxide content of the oxide aggregates being 10–20% by volume.

(6) A high-frequency dielectric material according to any of (1) to (5) above, wherein the composition of the glass is $SiO_2$: 50–70 mol %, $Al_2O_3$: 5–20 mol % $B_2O_3$: 0–10 mol % and one or more alkaline earth metal oxides: 25–45 mol %.

(7) A high-frequency dielectric material according to any of (1) to (6) above, wherein the dielectric constant temperature coefficient $\tau\epsilon$ of the glass at 2 GHz, −40°–125° C. is 150–170 ppm/°C. and the mean coefficient of thermal expansion thereof at 40°–290° C. is $5.5$–$6.5 \times 10^{-6}$ deg$^{-1}$.

(8) A high-frequency dielectric material according to any of (1) to (7) above, wherein the dielectric constant temperature coefficient $\tau\epsilon$ thereof is −40–+20 ppm/°C.

(9) A high-frequency dielectric material according to any of (1) to (8) above, wherein the glass content is 50–80% by volume based on the total of oxide aggregates and glass and the softening point of the glass is 700°–900° C.

(10) A resonator characterized in being constituted by laminating dielectric layers formed using a high-frequency dielectric material according to any one of (1) to (9) above and forming at least a strip line between the dielectric layers.

(11) A method of producing a resonator by
using glass having a dielectric constant temperature coefficient $\tau\epsilon$ at 2 GHz, −40°–125° C. of 150–170 ppm/°C. and a mean coefficient of thermal expansion at 40°–290° C. of $5.5$–$6.5 \times 10^{-6}$ deg$^{-1}$ aluminum oxide aggregate and titanium oxide aggregate, mixing them to obtain a high-frequency dielectric material wherein the amount of glass/(glass+aggregate) is 50–80% by volume and the amount of titanium oxide/(titanium oxide+aluminum oxide) is 40–60% by volume, and using the high-frequency dielectric material to form a laminate of dielectric layers, forming a strip line of conductive material in the laminate, and sintering the result to obtain a resonator, the dielectric constant temperature coefficient $\tau\epsilon$ of the laminate being −40–+20 ppm/°C., whereby the resonant frequency temperature coefficient $\tau f$ of the resonator is lowered.

(12) A method of producing a resonator according to (11) above, wherein the composition of the glass is $SiO_2$: 50–70 mol %, $Al_2O_3$: 5–20 mol % $B_2O_3$: 0–10 mol % and one or more alkaline earth metal oxides: 25–45 mol %, and the softening point thereof is 700°–900° C.

FUNCTION AND EFFECT

In this invention, an oxide aggregate material with a positive dielectric constant temperature coefficient $\tau\epsilon$, an oxide aggregate material with a negative dielectric constant temperature coefficient $\tau\epsilon$, and glass are mixed in a prescribed mixing ratio to constitute a high-frequency dielectric material whose $\tau\epsilon$ approaches zero. The high-frequency dielectric material can be used to obtain a resonator whose resonant frequency temperature coefficient $\tau f$ approaches zero. As a result, there can be realized a high-frequency resonator whose resonant frequency varies little with temperature change even when used in a high-frequency band, for example at a frequency of 0.5 GHz or higher.

SPECIFIC CONSTITUTION

Figure 1:
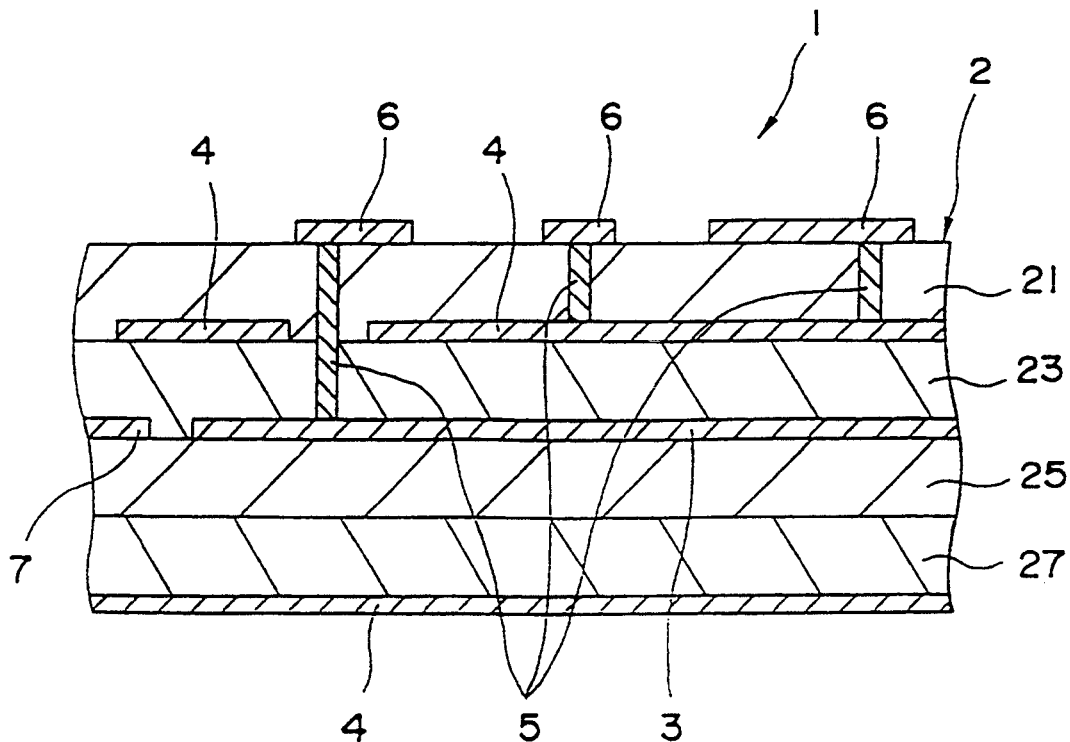
FIG. 1 is a partial sectional view of a voltage controlled oscillator using the resonator of this invention and FIG. 2 is perspective view of a voltage controlled oscillator using the resonator of this invention.

The specific constitution of the invention will now be explained.

The high-frequency dielectric material of this invention can be sintered at a temperature below around 1,000° C., for example at a temperature of around 800°-1,000° C., and is a substrate material for a resonator to be used at a frequency of 0.5 GHz or higher, for example at a temperature of 0.5 GHz-2 GHz. It contains glass and oxide aggregates. As the oxide aggregates there is used an oxide aggregate with a positive dielectric constant temperature coefficient $\tau\epsilon$ and an oxide aggregate with a negative $\tau\epsilon$.

As examples of oxide aggregates with a positive $\tau\epsilon$ there can, for example, be mentioned magnesium titanate ($MgTiO_3$), aluminum oxide ($Al_2O_3$), $R_2Ti_2O_7$ (where R is one or more lanthanoids), $Ca_2Nb_2O_7$, $SrZrO_3$, $SrZrO_3$ and the like. While these can be used singly or in combinations of two or more, from the point of low reactivity with glass at the time of sintering and other factors, it is preferable to use one or more of $MgTiO_3$, $Al_2O_3$, $R_2Ti_2O_7$ and $SrZrO_3$, and particularly preferable to use $MgTiO_3$ or $Al_2O_3$. At 2 GHz and $-40°-125°$ C., the us of these is about 80-300 ppm/°C., the $\tau\epsilon$ of $MgTiO_3$ being about $+100$ ppm/°C. and the $\tau\epsilon$ of $Al_2O_3$ being about 120 ppm/°C.

Their mean coefficient of thermal expansion $\alpha$ at 40°-290° C. is about $6-12 \times 10^{-6}$ deg$^{-1}$, particularly about $6-10 \times 10^{-6}$ deg$^{-1}$, the $\alpha$ of $MgTiO_3$ being about $9.7 \times 10^{-6}$ deg$^{-1}$ and the $\alpha$ of $Al_2O_3$ being about $7.2 \times 10^{-6}$ deg$^{-1}$.

As examples of oxide aggregates with a negative $\tau\epsilon$ there can, for example, be mentioned calcium titanate ($CaTiO_3$), strontium titanate ($SrTiO_3$), titanium oxide ($TiO_2$), $SnO_2.TiO_2$, $ZrTiO_4$, $Ba_2Ti_9O_{20}$, $Sr_2Nb_2O_7$, $SrSnO_3$ and the like. While these can be used singly or in combinations of two or more, from the point of low reactivity with glass at the time of sintering and other factors, it is preferable to use one or more of $CaTiO_3$, $SrTiO_3$ and $TiO_2$. At 2 GHz the $\tau\epsilon$ of these is about $-30 - -4,000$ ppm/°C., the $\tau\epsilon$ of $CaTiO_3$ being about $-1,600/°C.$, the $\tau\epsilon$ of $SrTiO_3$ being about $-3,400/°C.$ and the $\tau\epsilon$ of $TiO_2$ being about $-920$ ppm/°C.

Their mean coefficient of thermal expansion $\alpha$ at 40°-290° C. is about $6-12 \times 10^{-6}$ deg$^{-1}$, the $\alpha$ of $CaTiO_3$ being about $11.2 \times 10^{-6}$ deg$^{-1}$, the $\alpha$ of $CaTiO_3$ being about $11.2 \times 10^{-6}$ deg$^{-1}$, the $\alpha$ of $SrTiO_3$ being about $9.4 \times 10^{-6}$ deg$^{-1}$, and the $\alpha$ of $TiO_2$ being about $7.1 \times 10^{-6}$ deg$^{-1}$.

In the case of these, the composition of the oxide aggregate used can diverge somewhat from the stoichiometric composition and there can be used a mixture including a divergent oxide or a mixture of divergent oxides. It should be mentioned that Patent Public Disclosure No. Hei 4-82297, a prior application with respect to the present application, proposes reducing the resonant frequency temperature coefficient $\tau f$ by using of $Al_2O_3$ and $TiO_2$ in combination. Thus, in this application, this combined use is excluded from the claimed high-frequency dielectric material. A special way of using the combination will, however, be proposed.

The invention does not particularly limit the mixing ratio of the oxide aggregate with positive $\tau\epsilon$ and the oxide aggregate with negative $\tau\epsilon$. In suffices to appropriately select the mixing ratio in the light of the $v\epsilon$ of the oxide aggregates used, the $\tau\epsilon$ of the glass, the mixing ratio of the aggregates and the glass and the like so as to cause the $\tau\epsilon$ of the high-frequency dielectric material to approach a prescribed value, namely, so as to cause the resonant frequency temperature coefficient $\tau f$ of the resonator to approach zero.

Although the mean grain diameter of the oxide aggregates is not particularly limited, it is preferably about 0.5-3 $\mu$m. When the mean grain diameter is below this range, sheet formation is difficult, and when it exceeds this range, the material of the resonator comes to lack strength.

Since as mentioned earlier, the high-frequency dielectric material of this invention is sintered at 1,000° C. or lower, it is preferable to use a glass with a softening point of around 700°-900° C. When the softening point exceeds 900° C., sintering at a temperature of 1,000° C. or lower becomes difficult, and when it is less than 700° C., the binder does not remove easily during sheet formation, giving rise to a problem regarding insulating property.

Although the composition of the glass used is not particularly limited, the following composition is preferable from the point that it enables a high-strength substrate to be obtained at a sintering temperature not higher than 1,000° C.

$SiO_2$: 50-70 mol %
$Al_2O_3$: 5-20 mol %
One or more alkaline earth metal oxides : 25-45 mol %,
$B_2O_3$: 0-10 mol %, In this case, as the alkaline earth metal oxides it is preferable to use one or more of SrO, CaO and MgO, and more preferable to use all three of these in combination. Where all three are used, it is preferable for the SrO content to be 15-30 mol %, the CaO content to be 1-8 mol % and the MgO content to be 1-7%.

The mean coefficient of thermal expansion $\alpha$ at 40°-290° C. of a glass of this composition is about $5.5-6.5 \times 10^{-6}$ deg$^{-1}$ and the dielectric constant temperature coefficient $\tau\epsilon$ thereof at 2 GHz, $-40°-125°$ C. is about 150 -170 ppm/°C. This way of reducing the $\tau\epsilon$ of the dielectric material and the dielectric layers and of lowering the $\tau f$ of the resonator, when a glass of this type is used, is not disclosed in the aforesaid public disclosure.

The softening point and coefficient of thermal expansion $\alpha$ can be measured using a differential thermal expansion meter. $\tau\epsilon$ can be calculated from the measured $\tau f$ of an actually fabricated dielectric resonator using the following equation.

$$\tau\epsilon = -2(\tau\epsilon f + \alpha) \qquad \text{Equation}$$

In this case, tff is determined by measuring the resonant frequency at 10° C. intervals between −50° C. and +50° C., using a constant temperature bath. Otherwise, it is possible, for instance, o prepare an approximately 1.4 mm square, 60 mm sample of prescribed shape, determine its dielectric constant by the method of perturbation and calculate $\tau\epsilon$ therefrom. In these cases, the $\alpha$ and $\tau\epsilon$ of the oxide aggregates and glass can be measured using a sintered mass of the aggregate alone or the glass.

Although the mean grain diameter of the glass is not particularly limited, a glass with a mean grain diameter of about 1–2.5 μm is ordinarily used from the point of formability etc.

The glass content is preferably 50–80% by volume, more preferably 65–75% by volume, based on the total of oxide aggregates and glass. An excessively high glass content degrades the sinterability and an excessively low one lowers the dielectric's resistance to bending.

When an $Al_2O_3$ aggregate ($\tau\epsilon > 0$) and a $TiO_2$ aggregate ($\tau\epsilon < 0$) are used together with a glass of the aforesaid composition ($\tau\epsilon > 0$), the $TiO_2$ aggregate content is preferably 40–60% by volume, more preferably 45–55% by volume, based on the total of $Al_2O_3$ aggregate and $TiO_2$ aggregate. When the $TiO_2$ aggregate content is higher than the aforesaid range, the $\tau\epsilon$ of the high-frequency dielectric material becomes too small (lower than −40 ppm/°C., for example), and when the $TiO_2$ content is below the aforesaid range, the $\tau\epsilon$ of the high-frequency dielectric material becomes to large (higher than 20 ppm/°C., for example).

In a preferred embodiment, $MgTiO_3$ or $Al_2O_3$ aggregate ($\tau\epsilon > 0$) is used with $CaTiO_3$ aggregate ($\tau\epsilon < 0$). In this case, the $CaTiO_3$ content of the oxide aggregates is, for similar reasons, preferably 5–20% by volume. Further, it is preferable to use $MgTiO_3$ or $Al_2O_3$ aggregate ($\tau\epsilon > 0$) with $SrTiO_3$ aggregate ($\tau\epsilon < 0$). For similar reasons, it is preferable for $SrTiO_3$ content of the oxide aggregates to be 2–10% by volume. A combination of $MgTiO_3$ aggregate ($\tau\epsilon > 0$) and $TiO_2$ aggregate ($\tau\epsilon < 0$) is also preferable. The $TiO_2$ content of the oxide aggregates is, for similar reasons, preferably 10–20% by volume.

Thus, in this invention, for lowering the $\tau f$ of the resonator, the $\tau\epsilon$ of the high-frequency dielectric material is brought near a prescribed value by adjusting the content ratio by volume of the $\tau\epsilon > 0$ oxide aggregate and the $\tau\epsilon <$ oxide aggregate in accordance with the $\tau\epsilon$ and $\alpha$ of the glass, the glass content, the $\tau\epsilon$ and $\alpha$ of the $\tau\epsilon > 0$ oxide aggregate and the $\tau\epsilon$ and $\alpha$ of the $\tau\epsilon < 0$ oxide aggregate and the like.

In this case, it is preferable to cause the dielectric constant temperature coefficient $\tau\epsilon$ of the high-frequency dielectric material at a frequency of 2 GHz and −40°–125° C. to become −40–20 ppm/°C., more preferably to become −25–+5 ppm/°C., and ideally to cause $\tau\epsilon$ to become such that, in accordance with the equation $\tau\epsilon = -2(\tau f + \alpha)$, If becomes zero. Where the $\alpha$ of the dielectric is about $6.0 \times 10^{-6}$ deg$^{-1}$, for example, a $\tau\epsilon$ of about −12 ppm/°C. is preferable. It should be noted that it is possible to obtain a $\tau f$ of −15–+15 ppm/°C., particularly of −10–+10 ppm/°C., and further of −5–+5 ppm/°C. Further, the mean coefficient of thermal expansion $\alpha$ at 40°–290° C. of the dielectric layers or substrate obtained by sintering the high-frequency dielectric material of the invention is about 6.3–6.7$\times 10^{-6}$ deg$^{-1}$ and the relative dielectric constant thereof is about 8–20, particularly 8–12, and further 10–11.

Prior to being sintered, the high-frequency dielectric material is made into a slurry by addition of a vehicle. As examples of the vehicle there can be listed binders such as ethyl cellulose, polyvinyl butyral, methacrylic resin and butyl methacrylate, solvents such as terpineol, Butyl Carbitol, Butyl Carbitol Acetate, acetate, toluene, alcohol and xylene, and various dispersants, activators, plasticizers etc. Desired ones of these can be appropriately selected according to purpose. The amount of the vehicle added is preferably about 65–85% by weight based on the total amount of oxide aggregates and glass as 100 parts by weight.

Next, a voltage controlled oscillator (VCO) having a resonator consisting of dielectric layers formed using the high-frequency dielectric material of the present invention will be explained with reference to a preferred example shown in FIG. 1. (FIG. 1 is a partial sectional view of the voltage controlled oscillator.)

The voltage controlled oscillator 1 using the resonator according to this invention is used at a frequency of 0.5 GHz or higher, particularly 0.5–2 GHz. As illustrated, it comprises a laminate 2 formed by integrally laminating dielectric layers 21, 23, 25 and 27 and has a Strip line 3 at least between the dielectric layers 23 and 25 of the laminate 2. The shape, dimensions, number etc. of the strip line are not particularly specified and can be appropriately decided according to purpose or the like.

If required, an internal conductor 7 is further formed between the dielectric layers 23 and 25. In such case, the internal conductor 7 is formed in the pattern of, for example, a coil conductor or a capacitor terminal, or in any of various other patterns as desired in the light of the purpose or application.

Further, ground planes 4 are formed between the dielectric layers 23 and 21 and on the dielectric layer 27. At this time, the strip line 3 is positioned between the ground planes 4, 4.

External conductors 6 are formed on the laminate 2. The external conductors 6 are electrically connected with the strip line 3, the ground plane 4 and the internal conductor 7 by conductors in respective through-holes 5.

As the strip line 3, ground planes 4, internal conductor 7 and conductors in the through-holes 5, it is preferable, from the point of placing priority on good conductivity and the like, to use conductors consisting predominantly of Ag or Cu, particularly of Ag in cases where the sintering is to be conducted in an oxygen-containing atmosphere such as air. As the external conductors 6, it is preferable, from the point anti-migration property, solder eatability, solder wettability and the like, to use a conductor consisting predominantly of Ag or Cu and particularly a conductor containing Ag together with Pd and/or Pt in cases where the sintering is to be conducted in an oxygen-containing atmosphere such as air.

Such a resonator is fabricated as follows, for example. First, an internal conductor paste and an external conductor paste are separately prepared. These pastes contain a conductor powder, glass frit at about 1–5% by weight based on the conductor powder, and a vehicle. Next, green sheets for constituting the dielectric layers are prepared. Specifically, a slurry of the aforementioned high-frequency dielectric material according to the invention is used to fabricate a prescribed number of green sheets by, for example, the doctor blade method.

Next, the through-holes 5 are formed in the green sheets with a punching machine or a die press, and then the internal conductor paste is printed onto the respective green sheets by, or example, the screen printing method, so as to form the internal conductor 7, strip line 3 and ground planes 4 in prescribed patterns, and to fill the through-holes 5.

Following this, the green sheets are stacked and pressed into a green sheet laminate by a hot press (at about 40°–120° C., 50–1,000 Kgf/cm$^2$). If necessary, the resulting green sheet laminate is subjected to binder removal and formation of cutting notches.

The green sheet laminate is then sintered into an integral body, ordinarily in air, at a temperature not higher than 1,000° C., particularly about 800°–1,000° C., for about 10 minutes, thereby obtaining a resonator having the strip line 3 between the dielectric layers 23 and 25. In addition, the external conductors paste is printed by the screen printing technique or the like and sintered to form the external conductors 6. The external conductors 6 are preferably sintered simultaneously with the dielectric layers 21, 23, 25 and 27.

Figure 2:
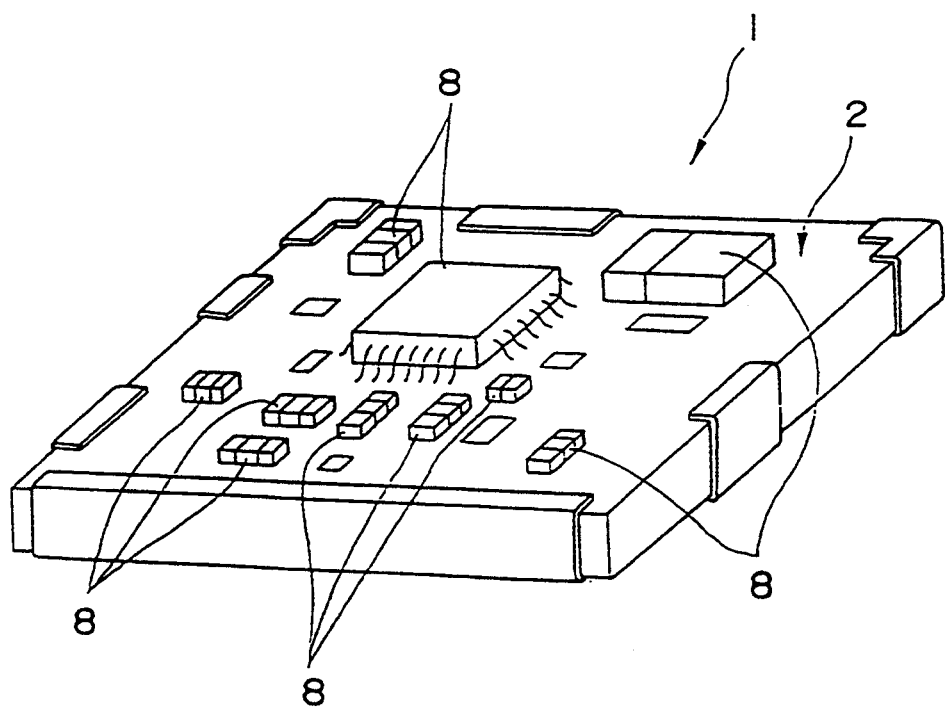

Then prescribed surface-mounted components 8 are soldered to the external conductors 6 and, if required, an insulating cladding layer is formed. The voltage controlled oscillator (VCO) 1 shown in FIG. 2 is thus obtained.

The resonator described above is only one example of the invention. It is not subject to any particular restrictions and can be of various forms insofar as it has a TEM line or other such strip line between dielectric layers and can be used at a frequency of not less than 0.5 GHz. Specifically, the resonator according to the invention can be applied as a filter such as a high-pass filter, low-pass filter, band-pass filter or bandelimination filter or the like or as a wave-separation filter obtained by combining the foregoing filters, deplexer, voltage controlled resonator or the like. The resonant frequency of the resonator according to this invention varies little with temperature change.

WORKING EXAMPLES

Concrete examples of the invention will now be shown, and the invention explained in further detail.

EXAMPLE NO. 1

A high-frequency dielectric material No. 1 according to the invention was prepared to comprise glass powder of a mean particle diameter of 1.9 μm: 70% by volume; $Al_2O_3$ powder of a mean particle diameter of 1.5 μm: 15% by volume; and $TiO_2$ powder of a mean particle diameter of 1.0 μm: 15% by volume. 73 parts by weight of a vehicle was added to 100 parts by weight of this high-frequency dielectric material and the two were mixed with a ball mill to obtain a slurry. In the vehicle, an acrylic resin was used as the binder, ethyl alcohol and toluene as the solvent and phthalate as the plasticizer. The composition of the glass powder was $SiO_2$: 62 mol %; $Al_2O_3$: 8 mol %; $B_2O_3$: 3 mol %; SrO: 20 mol %; CaO: 4 mol %; and MgO: 3 mol %. Its softening point was 815° C.

When $Al_2O_3$, $TiO_2$ and glass were independently sintered and tested for $\alpha$ and for relative dielectric constant $\epsilon_r$ and $\tau\epsilon$ at 2 GHz, $Al_2O_3$ was found to have an $\alpha$ of $7.2 \times 10^{-6}$ deg$^{-1}$, a $\tau\epsilon$ of $+120$ ppm/°C. and a $\epsilon_r$ of 9, 8, $TiO_2$ to have an $\alpha$ of $7.1 \times 10^{-6}$ deg$^{-1}$, a $\tau\epsilon$ of $-920$ ppm/°C. and a $\epsilon_r$ of 104, and the glass to have an $\alpha$ of $6.0 \times 10^{-6}$ deg$^{-1}$, a $\tau\epsilon$ of $+160$ ppm/°C. and a $\epsilon_r$ of 6, 5

A paste of this high-frequency dielectric material was used to prepare 0.25 mm thick green sheets by the doctor blade method.

Next, the respective green sheets were printed with an Ag internal conductor paste by the screen printing method to form a strip line and ground planes, whereafter they were laminated with a hot press to obtain a green sheet laminate. The laminate was degreased and then subjected to single-stage sintering in air at a temperature of 900° C. for 10 minutes.

Following his, ground plane Ag paste was printed on by the screen printing method and the result was sintered in air at a temperature of 850° C. for 10 minutes to obtain a resonator Sample No. 1 with a resonant frequency of about 2 GHz. The Sample No. 1 measured 10 mm × 10 mm × 2 mm.

For comparison, a high-frequency dielectric material No. 2 was obtained in the same way except that the oxide aggregate mixture of $Al_2O_3$: 15% by volume and $TiO_2$: 15% by volume in the high-frequency dielectric material No. 1 was replaced with $Al_2O_3$: 30% by volume. Then a resonator Sample No. 2 with a resonant frequency of about 2 GHz was fabricated in the same way as the resonator Sample No. 1 except that the high-frequency dielectric material No. 2 was used. The Sample No. 2 measured 10 mm × 10 mm × 2 mm.

Each sample obtained was measured for its resonant frequency temperature coefficient $\tau f$ at $-40°$–$125°$ C., with the results shown in Table 1.

Further, the coefficients of thermal expansion $\alpha$ of the dielectric layers obtained by sintering the respective high-frequency dielectric materials, and the dielectric constant temperature coefficients $\tau\epsilon$ were calculated from the equation set out below. The values of $\tau\epsilon$ and the mean coefficients of thermal expansion $\alpha$ at $-40°$–$125°$ C. were as shown in Table 1.

$$\tau\epsilon = -2 (\tau f + \alpha) \quad \text{Equation}$$

In addition, the relative dielectric constant $\epsilon_r$ of each high-frequency dielectric material at a frequency of 2 GHz and 25° C. was measured by the method of perturbation, with the results shown in Table 1.

TABLE 1

| Sample No. | High-frequency dielectric material No. | Oxide aggregates | $\epsilon_r$ | $\alpha$ (deg$^{-1}$)(ppm/°C.) | $\tau\epsilon$ | $\tau f$ (ppm/°C.) |
| --- | --- | --- | --- | --- | --- | --- |
| 1 (Invention) | 1 | $Al_2O_3/TiO_2$ | 10.6 | 6.5 | $-12$ | $-0.5$ |
| 2 (Comparison) | 2 | $Al_2O_3$ | 7.4 | 6.4 | 129.8 | $-58.6$ |

The effect of the invention is obvious from the results shown Table 1.

EXAMPLE NO. 2

In addition to the $Al_2O_3$, $TiO_2$ and glass of the first example, $CaTiO_3$ of a mean grain diameter of 2.0 μm ($\tau\epsilon = -1,600$ ppm/°C., $\alpha = 11.2 \times 10^{-6}$ deg$^{-1}$), $SrTiO_3$ of a mean grain diameter of 2.0 μm ($\tau\epsilon = -3,400$ ppm/°C., $\alpha = 9.4 \times 10^{-6}$ deg$^{-1}$) and MgTiO$_3$ of a mean grain diameter of 2.0 μm ($\tau\epsilon = +100$ ppm/°C., $\alpha = 9.7 \times 10^{-6}$ deg$^{-1}$) were used, in the mixing ratios shown in Table 2, for obtaining resonators in the same way as in the first example. The results are shown in Table 2.

TABLE 2

| Sample No. | Glass (Vol %) | $\tau\epsilon < 0$ (Vol %) | $\tau\epsilon > 0$ (Vol %) | $\epsilon_r$ | $\tau f$ (ppm/°C.) |
|---|---|---|---|---|---|
| 2 (Comparison) | 70.0 | 0 | 30.0 | 7.4 | −58.6 |
| 11 (Invention) | 70.0 | 13.5 TiO$_2$ | 16.5 Al$_2$O$_3$ | 10.9 | −7.8 |
| 1 (Invention) | 70.0 | 15.0 TiO$_2$ | 15.0 Al$_2$O$_3$ | 10.6 | −0.5 |
| 12 (Invention) | 70.0 | 16.5 TiO$_2$ | 13.5 Al$_2$O$_3$ | 10.1 | 7.3 |
| 13 (Invention) | 60.0 | 16.0 TiO$_2$ | 24.5 Al$_2$O$_3$ | 11.2 | 7.8 |
| 14 (Comparison) | 100.0 | 0 | 0 | 6.5 | −85.0 |
| 21 (Invention) | 70.0 | 10.0 CaTiO$_3$ | 20.0 Al$_2$O$_3$ | 9.7 | 9.5 |
| 22 (Invention) | 60.0 | 8.0 CaTiO$_3$ | 32.0 Al$_2$O$_3$ | 9.8 | −4.6 |
| 31 (Invention) | 70.0 | 9.0 CaTiO$_3$ | 21.0 MgTiO$_3$ | 10.4 | 3.1 |
| 32 (Invention) | 60.0 | 8.0 CaTiO$_3$ | 32.0 MgTiO$_3$ | 11.5 | −1.4 |
| 41 (Invention) | 70.0 | 4.5 SrTiO$_3$ | 25.5 Al$_2$O$_3$ | 8.5 | 1.6 |
| 42 (invention) | 60.0 | 4.0 SrTiO$_3$ | 36.0 Al$_2$O$_3$ | 8.8 | −4.0 |
| 51 (Invention) | 70.0 | 4.0 SrTiO$_3$ | 26.0 MgTiO$_3$ | 9.7 | −4.4 |
| 52 (Invention) | 60.0 | 4.0 SrTiO$_3$ | 36.0 MgTiO$_3$ | 10.6 | −0.4 |
| 61 (Invention) | 70.0 | 14.5 TiO$_2$ | 15.5 MgTiO$_3$ | 11.3 | −1.2 |
| 62 (Invention) | 60.0 | 14.0 TiO$_2$ | 26.0 MgTiO$_3$ | 12.3 | 0.3 |

The effect of the invention is obvious from the results shown Table 2.

We claim:

1. A high-frequency dielectric material comprising 50–80% by volume glass, and 50–20% by volume of a mixture of an oxide with a positive dielectric constant temperature coefficient $\tau\epsilon$ and an oxide with a negative dielectric constant temperature coefficient $\tau\epsilon$, wherein said glass has the following composition:
   SiO$_2$: 50–70 mol %
   Al$_2$O$_3$: 5–20 mol %
   B$_2$O$_3$: 0–10 mol %
   one or more alkaline earth metal oxides: 25–45 mol %
   and wherein the oxide with a positive $\tau\epsilon$ is one or both of aluminum oxide and magnesium titanate and the oxide with a negative $\tau\epsilon$ is one or more of calcium titanate, strontium titanate and titanium oxide, but wherein aluminum oxide and titanium oxide are not both present in said material.

2. A high-frequency dielectric material according to claim 1, which contains calcium titanate as the oxide with a negative $\tau\epsilon$ and magnesium titanate or aluminum oxide as the oxide with a positive $\tau\epsilon$, the calcium titanate content of the oxides being 5–20% by volume.

3. A high-frequency dielectric material according to claim 1, which contains strontium titanate as the oxide with a negative $\tau\epsilon$ and magnesium titanate or aluminum oxide as the oxide with a positive $\tau\epsilon$, the strontium titanate content of the oxides being 2–10% by volume.

4. A high-frequency dielectric material according to claim 1, which contains titanium oxide as the oxide with a negative $\tau\epsilon$ and magnesium titanate as the oxide with a positive $\tau\epsilon$, the titanium oxide content of the oxides being 10–20% by volume.

5. A high-frequency dielectric material according to any of claims 1 to 4, wherein the dielectric constant temperature coefficient $\tau\epsilon$ of the glass at 2 GHz, −40°–125° C. is 150–170 ppm/°C. and the mean coefficient of thermal expansion thereof at 40°–290° C. is 5.5–6.5 × 10$^{-6}$ deg$^{-1}$.

6. A high-frequency dielectric material according to any of claims 1 to 4, wherein the dielectric constant temperature coefficient $\tau\epsilon$ thereof is −40–+20 ppm/°C.

7. A high-frequency dielectric material according to any of claims 1 to 4, wherein the glass content is 50–80% by volume based on the total of oxides and glass and the softening point of the glass is 700°–900° C.

8. A resonator comprising laminated dielectric layers formed from a high-frequency dielectric material according to any one of claims 2 to 5 and having at least a strip line between the dielectric layers.

9. A method of producing a resonator comprising the steps of:
   providing glass having a dielectric constant temperature coefficient $\tau\epsilon$ at 2 GHz, −40°–125° C. of 150–170 ppm/°C. and a mean coefficient of thermal expansion at 40°–290° C. of 5.5–6.5 × 10$^{-6}$ deg$^{-1}$, aluminum oxide and titanium oxide,
   mixing said glass, aluminum oxide and titanium oxide together to obtain a high-frequency dielectric material wherein the amount of glass/(glass + oxide) is 50–80% by volume and the amount of titanium oxide/(titanium oxide + aluminum oxide) is 40–60% by volume, and
   forming a laminate of dielectric layers having a dielectric constant temperature coefficient $\tau\epsilon$ of −40–+20 ppm/°C. with said high-frequency dielectric material, forming a strip line of conductive material in the laminate, and sintering the result to obtain a resonator.

10. A method of producing a resonator according to claim 9, wherein the composition of the glass is SiO$_2$: 50–70 mol %, Al$_2$O$_3$: 5–20 mol % B$_2$O$_3$: 0–10 mol % and one or more alkaline earth metal oxides: 25–45 mol %, and the softening point thereof is 700°–900° C.

11. The method of claim 9, wherein said glass, aluminum oxide and titanium oxide are mixed together to form a slurry in the presence of a vehicle.

* * * * *